United States Patent [19]
Chito

[11] Patent Number: 4,626,702
[45] Date of Patent: Dec. 2, 1986

[54] SAW-TOOTH WAVE GENERATING CIRCUIT
[75] Inventor: Yasuo Chito, Saitama, Japan
[73] Assignee: Canon Kabushiki Kaisha, Tokyo, Japan
[21] Appl. No.: 675,335
[22] Filed: Nov. 27, 1984
[30] Foreign Application Priority Data
Nov. 30, 1983 [JP] Japan ................. 58-224391
[51] Int. Cl.⁴ ............................................. H03K 4/50
[52] U.S. Cl. ..................... 307/228; 328/183
[58] Field of Search ............... 331/111, 143; 307/109, 307/228; 328/181, 182, 183, 184, 185

[56] References Cited
U.S. PATENT DOCUMENTS
4,035,744  7/1977  Fukaya et al. ..................... 331/111
4,191,932  3/1980  Nagahama ....................... 307/228 X
4,233,575 11/1980  Chapman et al. .................. 331/111
4,413,237 11/1983  Baba ............................. 331/111
4,450,415  5/1984  Gontowski, Jr. ................. 307/228 X Primary Examiner—Siegfried H. Grimm
Attorney, Agent, or Firm—Toren, McGeady, Stanger, Goldberg & Kiel

[57] ABSTRACT

A saw-tooth wave generating circuit is formed by providing a constant current source with negative feedback through an operational amplifier. The operational amplifier compares a reference voltage with the voltage across a resistor through which a current of the constant current source is flowing, to produce a control voltage for the constant current source. The saw-tooth wave is generated across a capacitor which is charged by the constant current source and is discharged through a transistor which receives a periodic pulse signal.

17 Claims, 4 Drawing Figures

… (column 1)

SAW-TOOTH WAVE GENERATING CIRCUIT

BACKGROUND OF THE INVENTION

1. Field of the Invention:

This invention relates to a saw-tooth wave generating circuit and more particularly to an improvement on a saw-tooth wave generating circuit generally used, for example, in a frequency-to-voltage converting circuit for servo circuits of varied kinds.

2. Description of the Prior Art

FIG. 1A shows a saw-tooth wave generator of a frequency-to-voltage converter used in various kinds of servo circuits. The illustrated circuit includes a constant voltage source KV1 of a suitable value; a charging current limiting resistor R1; NPN type transistors Tr1 and Tr2 having a common base; a power supply Vcc; PNP type transistors Tr3 and Tr4 having a common base; a charging capacitor C; and an NPN type transistor Tr5 for discharging the electric charge of the capacitor C. This saw-tooth wave generator of the prior art thus includes components which form a constant current charging circuit composed of the transistors Tr1–Tr4 and the capacitor C and form a discharge circuit which consists of the transistor Tr5. In the charging circuit, the capacitor C accumulates an electric charge which can be expressed as: Charging current $$I = \frac{KV1 - VBE\,(Tr1)}{R1},$$

wherein VBE (Tr1) represents a voltage between the base and emitter of the transistor Tr1. The electric charge is instantaneously discharged through the transistor Tr5 by a pulse current coming through a terminal C-IN. The output thus produced has a saw-tooth wave form as shown in FIG. 1B. However, the above-stated voltage VBE varies with temperature and the charging current I also varies. This causes some change in the inclination of the saw-tooth wave produced, as indicated by the broken lines in FIG. 1B. The peak voltage value of the saw-tooth wave outputs thus has a temperature dependency. This has been a drawback of prior art circuit arrangements.

Because the current amplification factor of the complementary transistors Tr3 and Tr4 depends on the power supply voltage Vcc, the peak voltage value of the saw-tooth wave output has a power supply voltage dependency. This represents another drawback. This is especially serious for a long period saw-tooth wave and has presented a grave problem in saw-tooth wave generating circuits used for frequency-to-voltage converting circuits in servo circuits and the like.

SUMMARY OF THE INVENTION

It is therefore a general object of the present invention to provide a saw-tooth wave generating circuit which eliminates the above-stated drawbacks of the prior art.

It is a more specific object of the invention to provide a saw-tooth wave generating circuit having a diminished temperature dependency.

It is another specific object of the invention to provide a saw-tooth wave generating circuit capable of stably supplying a long-period saw-tooth wave.

To attain these objects, a saw-tooth wave generating circuit according to this invention is arranged to solve the above-stated problems relative to temperature and the long period saw-tooth wave. One input terminal of an operational amplifier is supplied with a reference voltage and the other input terminal of the operational amplifier is supplied with a current from a constant current circuit obtained as the voltage across a resistor. The output of the operational amplifier is used as a reference voltage for the constant current circuit, which is composed of a transistor circuit.

These and further objects and features of the invention will become apparent from the following detailed description of a preferred embodiment thereof taken in connection with the accompanying drawings.

DETAILED DESCRIPTION OF THE PREFERRED EMBODIMENT

Figure 1A:
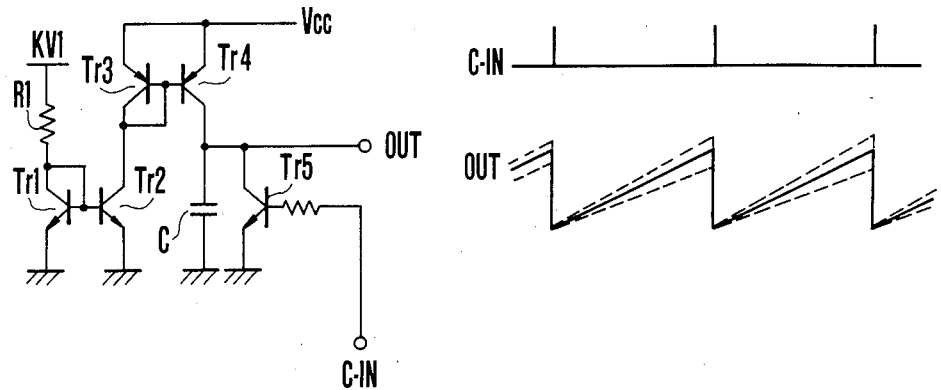
FIG. 1A is a circuit diagram showing the conventional saw-tooth wave generating circuit.
Figure 1B:
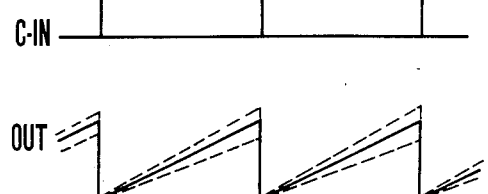
FIG. 1B is a chart showing the operating wave form of the circuit of FIG. 1A.
Figure 2A:
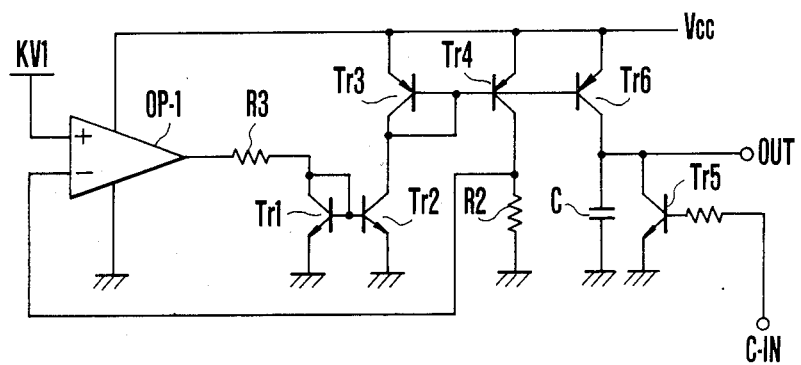
FIG. 2A is a circuit diagram showing a saw-tooth wave generating circuit arranged according to this invention.
Figure 2B:
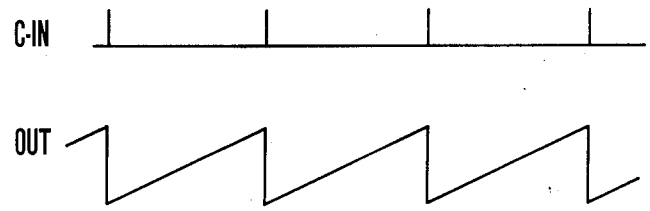
FIG. 2B is a chart showing the operation wave form of the circuit of FIG. 2A.

FIGS. 2A and 2B show a preferred embodiment of this invention. In these drawings, the same elements as those of the prior art example of FIGS. 1A and 1B are indicated by the same reference symbols and their details are omitted from the following description. Referring to FIG. 2A, transistors Tr4 and Tr6 are arranged on the same semiconductor substrate chip to have a common base and equivalent characteristics. Their emitter currents are also equal to each other. The second transistor Tr6 is also of the PNP type. An operational amplifier OP-1 is arranged to receive at its first input terminal, which is an inversion input terminal, a voltage detected by a charging current limiting resistor R2, which serves as a current detecting element. The second input terminal of the operational amplifier OP-1 is arranged to receive a constant voltage KV1, which is a reference voltage of a suitable value. Further, the operational amplifier OP-1 is arranged, for example, as a differential amplification circuit. The output of the operational amplifier OP-1 is supplied via a resistor R3 to the collector base of the transistor Tr1 and the base of the transistor Tr2. A loop series is formed by the operational amplifier OP-1, the transistors Tr1, Tr2, Tr3 and Tr4 and a resistor R2.

The transistor Tr6 is interposed in between the power supply Vcc and the capacitor C. Further, the transistors Tr1–Tr4 and Tr6 form a current control circuit and are arranged to function as a constant current source when the output current is changed by the output of the operational amplifier OP-1. Therefore, the charging current I applied to the capacitor C is the emitter current of the transistor Tr6. In other words, the emitter current of the transistor Tr6 becomes the same value as the emitter current of the transistor Tr1 which serves as the first transistor. Therefore, the above-stated loop series performs a negative feedback action to make the voltage of the two ends of the charging current controlling resistor R2 equal to the constant voltage KV1. Accordingly, the above-stated charging current I becomes I=KV1/R2. This excludes the above-stated voltage between the base and emitter of the transistor Tr1. The transistor Tr4 no longer directly participates in the charging process. Therefore, the embodiment eliminates the temperature dependency and voltage dependency of the prior art circuit previously mentioned. When a periodic pulse input is supplied via the terminal C-IN, the transistor Tr5 discharges the electric charge of the capacitor C, which serves as an integrating element. An operation wave form is obtained in a stable manner as shown in FIG. 2B.

In the embodiment, as described above, a feedback type constant current circuit is formed by including an operational amplifier in the conventional constant current circuit. This arrangement frees the saw-tooth wave generating circuit from the temperature dependency and the voltage dependency. In accordance with this invention, therefore, a saw-tooth wave can be stably generated over a wide range of temperature from a low temperature to a high temperature and also over a wide range of power supply voltage values. The advantageous effect of the invention is salient, especially in the case having a saw-tooth wave of a long period.

What is claimed is:

1. A saw-tooth wave generating circuit, comprising:
   (a) an operational amplifier having first and second input terminals and generating an output;
   (b) current control means for producing a current controlled by the output of said operational amplifier, said current control means being adapted for producing an output arranged to be fed back to the first input terminal of said operational amplifier, said current control means including at least two transistors having commonly controlled base voltages and through which the same current flows in correspondence to the output of said operational amplifier, and the output of one of said transistors being arranged to be fed back to the first input terminal of said operational amplifier, said current control means having another transistor;
   (c) a reference voltage source for supplying a reference voltage to the second input terminal of said operational amplifier;
   (d) integrating means for integrating a current produced by said other transistor; and
   (e) reset means for resetting said integrating means.

2. The circuit according to claim 1, wherein said current control means includes a constant current source.

3. The circuit according to claim 1, wherein said first input terminal is an inverting input terminal of said operational amplifier.

4. The circuit according to claim 1, wherein said second input terminal is a non-inverting input terminal of said operational amplifier.

5. The circuit according to claim 1, wherein said integrating means includes a capacitor for accumulating an electric charge.

6. The circuit according to claim 5, wherein said reset means includes a switch member for discharging the electric charge of said capacitor.

7. The circuit according to claim 1, wherein said current control means includes a plurality of transistors having bases connected in common.

8. The circuit according to claim 7, wherein said integrating means integrates said current flowing through said other transistor which is one of said plurality of transistors.

9. The circuit according to claim 1, wherein said reset means periodically resets said integrating means.

10. A saw-tooth wave generating circuit, comprising:
    (a) amplification means for amplifying a difference between first and second inputs supplied thereto;
    (b) current control means connected to an output terminal of said amplification means, said current control means having an output arranged to change according to the output of said amplification means, said current control means having at least two transistors whose base voltages are commonly controlled in correspondence to the output of said amplification means and through which the same current flows, said current control means having another transistor;
    (c) feedback means arranged to feed back the output of one of said transistors of said current control means to said amplification means as the first input to said amplification means;
    (d) reference level forming means for forming said second input to said amplification means; and
    (e) integrating means for periodically integrating the output of said other transistor of said current control means.

11. The circuit according to claim 10, wherein said current control means includes a constant current source.

12. The circuit according to claim 10, wherein said feedback means includes a resistor arranged to detect a current produced by said current control means.

13. A saw-tooth wave generating circuit, comprising:
    (a) amplification means, having first and second input terminals, for amplifying a difference between inputs supplied to said first and second input terminals and generating an output;
    (b) a constant current circuit including output transistor means formed on a semiconductor substrate for producing a current which varies according to the output of said amplification means;
    (c) detecting means for detecting the current produced by said constant current circuit;
    (d) connecting means for connecting an output terminal of said detecting means to the first input of said amplification means;
    (e) input means for supplying a reference level signal to the second input of said amplification means;
    (f) a second transistor formed on the same semiconductor substrate of said output transistor means of said constant current circuit, said second transistor and said output transistor means having equivalent characteristics, the base potential of said second transistor being controlled commonly with the base potential of part of said output transistor means, and the output current of said second transistor being the same as the output current of said output transistor means; and
    (g) integrating means for integrating a current flowing through said second transistor.

14. The circuit according to claim 13, wherein said integrating means includes a capacitor.

15. The circuit according to claim 13, further comprising reset means for resetting the integrating of said integrating means.

16. The circuit according to claim 13, wherein said output transistor means and said second transistor have bases connected in common.

17. The circuit according to claim 13, wherein said detecting means includes a resistor.

* * * * *